United States Patent [19]

Buikema

[11] Patent Number: 4,899,113
[45] Date of Patent: Feb. 6, 1990

[54] SWITCHING HELIX POWER SUPPLY FOR A TWT

[75] Inventor: Wolter Buikema, Borne, Netherlands

[73] Assignee: Hollandse Signaalapparaten B.V., Hengelo, Netherlands

[21] Appl. No.: 209,451

[22] Filed: Jun. 15, 1988

[30] Foreign Application Priority Data

Jun. 29, 1987 [NL] Netherlands .................. 8701515

[51] Int. Cl.$^4$ .................. H03J 19/82; H03J 25/34
[52] U.S. Cl. .................. 328/258; 328/261; 328/262; 307/264; 307/296.1; 315/3.5; 315/39; 315/39.3; 315/209 R
[58] Field of Search .................. 328/258, 261, 262; 307/296 A, 264, 296 R, 296.3; 315/3.5, 39, 39.3, 415, 209 R, 246; 363/16, 21, 24–26

[56] References Cited

U.S. PATENT DOCUMENTS

| 3,369,188 | 2/1968 | Stover et al. | 315/3.5 |
| 3,566,180 | 2/1971 | Ewton | 315/3.5 |
| 3,573,536 | 4/1971 | Palmer et al. | 315/3.5 |
| 3,697,799 | 10/1972 | Caldwell et al. | 315/3.5 |
| 3,723,798 | 3/1973 | O'Brien | 315/3.5 |
| 3,760,219 | 9/1973 | DeSantis et al. | 315/3.5 |
| 4,544,862 | 10/1985 | Yamazaki et al. | 315/209 R |
| 4,695,935 | 9/1987 | Oen et al. | 363/21 |
| 4,777,406 | 10/1988 | Ross et al. | 315/3.5 |

FOREIGN PATENT DOCUMENTS 0141676 8/1983 Japan .................. 307/264

OTHER PUBLICATIONS

Walchli and Scott, "Traveling Wave Tubes", Electronics Engineers' Handbook, McGraw-Hill, 1975, pp. 944 and 945.

Primary Examiner—Stanley D. Miller
Assistant Examiner—Nancy Thai
Attorney, Agent, or Firm—Robert J. Kraus

[57] ABSTRACT

Switching power supply for generating a voltage for a pulsating load (2), in particular for generating a helix voltage for a TWT. The switching power supply is provided with a dc voltage source (1), a buffer (12) from which the load (2) is powered, and switches (3) and a control circuit (5) for regulating the charging of the buffer from the dc voltage source (1), whereby the power supply is provided with a circuit coupled to the dc voltage source (1), which circuit consists of a current source (6), the above-mentioned switches (3) and a primary (9) of a converter (7). The buffer (12) is powered from the secondary (11) of the said converter (7). The control circuit (5) controls the switches (3) by means of a signal which is a function of the rhythm of the pulsating load and the voltage across the buffer.

7 Claims, 5 Drawing Sheets

SWITCHING HELIX POWER SUPPLY FOR A TWT

BACKGROUND OF THE INVENTION

The invention relates to a switching power supply for generating a voltage for a pulsating load, in particular for generating a helix voltage for a TWT, where the switching power supply is provided with a dc voltage source, a buffer from which the load is powered, and switches and a control circuit for regulating the charging of the buffer from the dc voltage source.

The phase performance of a transmitter provided with a TWT is directly dependent on the helix voltage of the TWT. If such a transmitter is used in radar equipment, it is of crucial importance that the phase performance of the transmitter is extremely accurate. After all, Doppler information of a target is obtained from the phase difference between transmitted and reflected radio waves. This means that the supply voltage for the helix power of a TWT must be extremely accurate. A switching supply as described above however is not sufficiently accurate. The lack of accuracy in the power supply is caused by the fact that the buffer is charged in steps by switching of the supply. The size of such a step therefore contributes to the inaccuracy of the power supply.

SUMMARY OF THE INVENTION

The present invention has for its object to provide the possibility of developing a particularly accurate helix supply by means of a switching power supply provided with a circuit, coupled to the dc voltage source, which circuit consists of a current source, the above-mentioned switches, and a primary of a converter, where the buffer is powered from the secondary of the said converter and where the control circuit controls the switches by means of a signal which is a function of the rhythm of the pulsating load and the voltage across the buffer.

Because switching of the supply is a function of the possibly staggered PRF of the TWT, it is possible to charge the supply buffer in one go. This implies that, according to the invention, the supply is extremely accurate because the accuracy of the supply is not impaired by the step size as described above. In this context, accuracy means the extent of the TWT cathode voltage variation from pulse to pulse. The accuracy of the supply is now a function of the accuracy of a circuit included in the control circuit for measuring the voltage across the buffer. A special embodiment of the voltage measurement circuit is described below. This embodiment can further increase the accuracy of the power supply.

BRIEF DESCRIPTION OF THE DRAWINGS

The invention will be explained with reference to the accompanying figures, of which.

DESCRIPTION OF THE PREFERRED EMBODIMENT

Figure 1:
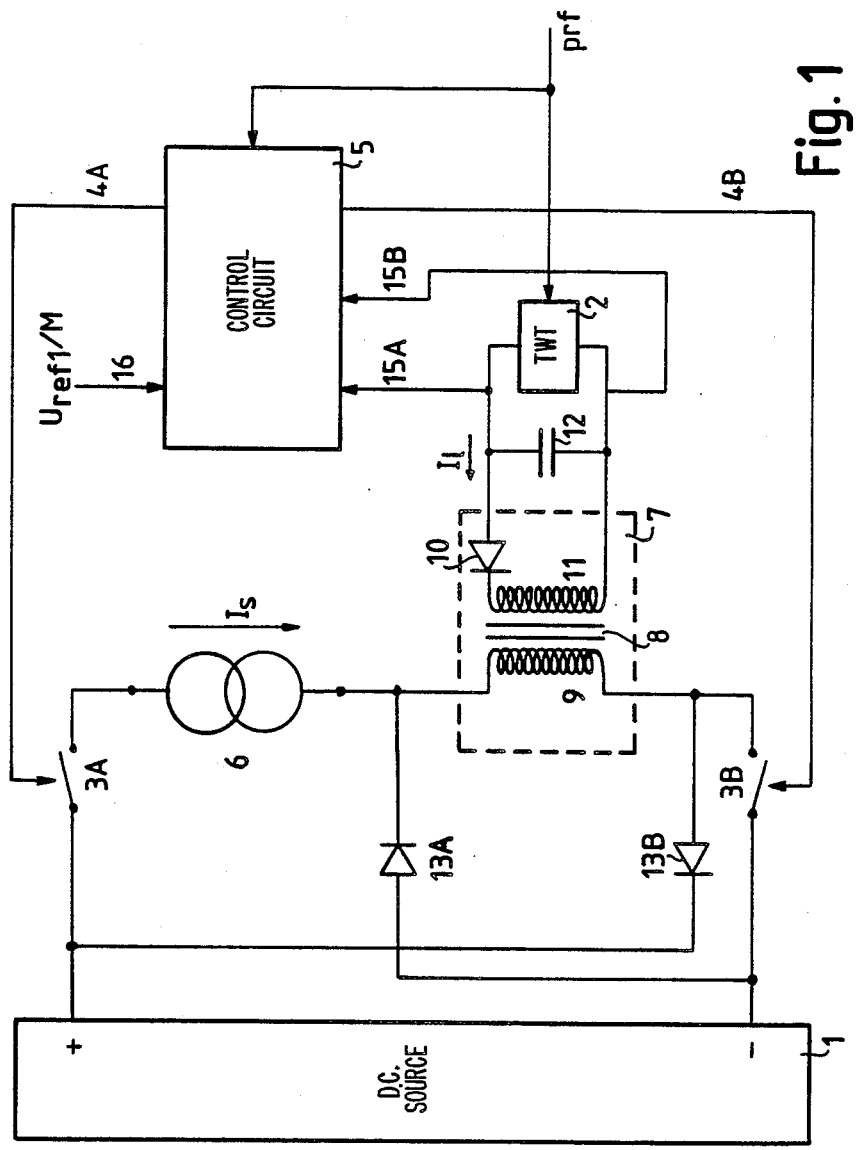
FIG. 1 is an embodiment of the power supply according to the invention.

FIG. 1 illustrates a dc voltage source 1 which supplies the power for the helix of a TWT 2. Switches 3A and 3B can be closed via lines 4A and 4B under control of control circuit 5. When switches 3A and 3B are closed simultaneously, a current source 6 will supply a constant current $I_s$. The current $I_s$ runs from the positive terminal of dc voltage source 1 via the said switches and via a current converter 7 to the negative terminal of dc power supply 1. Current converter 7 consists of a high-voltage transformer 8 of which the primary 9 is fed with current $I_s$ and of a diode 10 which is fed from secondary 11 of high-voltage transformer 8. Current $I_s$ through primary 9 determines the primary voltage of transformer 8 and thus current $I_1$ through secondary 11. A buffer 12 is charged via diode 10 by current $I_1$ of secondary 11. Charging current $I_1$ of buffer 12 is thus directly dependent on the value of current $I_1$ through primary 9.

The winding ratio $N_p/N_s$ of the primary and secondary (9 and 11 respectively) of transformer 8 is such that the voltage for charging buffer 12 will be sufficiently high. If switches 3A and 3B are opened by control means 5, current $I_s$ through the primary will become zero. The magnetisation energy in transformer 8 can then be returned to dc voltage source 1 via diodes 13A and 13B.

Figures 2A, 2B, 2C:
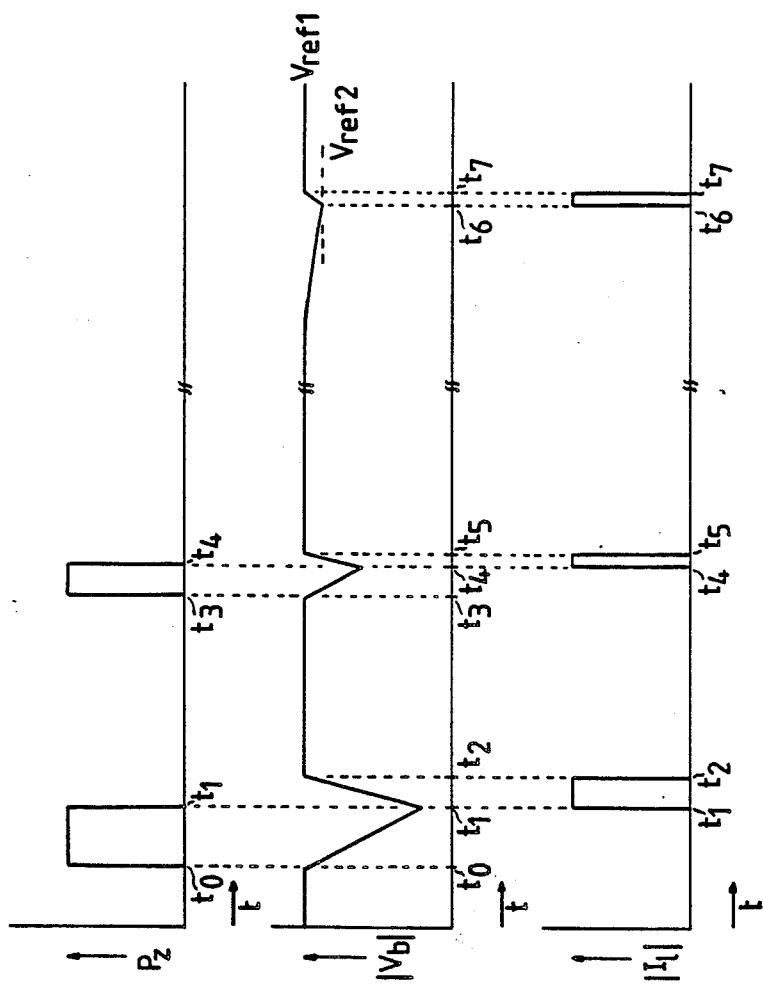
FIGS. 2A–2C are characteristics for explaining the operation of the power supply according to the invention.

The properties of the control circuit will be discussed below with reference to FIGS. 2A, 2B and 2C. The TWT 2 is controlled via line 14 by a grid modulator which is not indicated in FIG. 1. Between time $t=t_0$ and time $t=t_1$ TWT 2, under control of line 14, generates a pulse with a power $P_z$ as indicated in FIG. 2A. For this purpose, the TWT draws energy from buffer 12. Voltage $|V_b|$ will as a result decrease as indicated in FIG. 2B. The pulse is terminated at time $t=t_1$, so the buffer is no longer discharged. At this time $t=t_1$, switches 3A and 3B are also closed, causing buffer capacitor 12 is recharged with a constant current $$I_1 = I_s N_p/N_s.$$

As a result of charging current $I_1$ voltage $V_b$ across buffer 12 will increase again. Voltage $V_b$ is measured by control circuit 5 via lines 15A and 15B. A special embodiment of control circuit 5, enabling very accurate measurement of the said voltage, is later described with reference to FIG. 5. Control circuit 5 makes sure that switches 3A and 3B are opened again as soon as $V_b = V_{refl}$.

A reference voltage $-V_{refl}/M$ is supplied to control circuit 5 via line 16, determining the rating of voltage $V_b$ when buffer 12 is fully charged. M is a predetermined constant with $M \gg 1$.

At time $t=t_2$, $V_b=V_{refl}$, causing switches 3A and 3B to open and charging current $I_1$ to become 0, see FIGS. 2B and 2C. Between $t=t_3$ and $t=t_4$, TWT 2 is triggered via line 14 to transmit a short pulse, a so-called follow-up pulse (see FIG. 2A). Voltage $V_b$ of buffer 12 will now decrease less because the buffer is discharged during a shorter period of time. Control circuit 5 ensures that buffer 12 is recharged between times $t=t_4$ and $t=t_5$ in the same way as described above between $t=t_1$ and $t=t_2$.

It may sometimes be advisable to refrain from transmitting radar pulses, e.g. to prevent the radar installation in question from being located. The result is that buffer 12 is not regularly discharged and subsequently recharged. When this happens, voltage $V_b$ across buffer 12 may slowly decrease as a result of a leakage current. However, as soon as the control circuit establishes that voltage $V_b$ is lower than $V_{ref2}$, it will close switches 3A and 3B, so that the buffer will be recharged. As soon as $V_b = V_{ref1}$, switches 3A and 3B will be opened again. FIG. 2 illustrates a situation in which during a long period of time (between $t_5$ and $t_6$) no radar pulses are transmitted, as a result of which voltage $V_b$ slowly decreases. In this situation $t=t_6$ is the point in time when $V_b = V_{ref2}$, and $t=t_7$ is the point in time when $V_b = V_{ref1}$.

Figure 3:
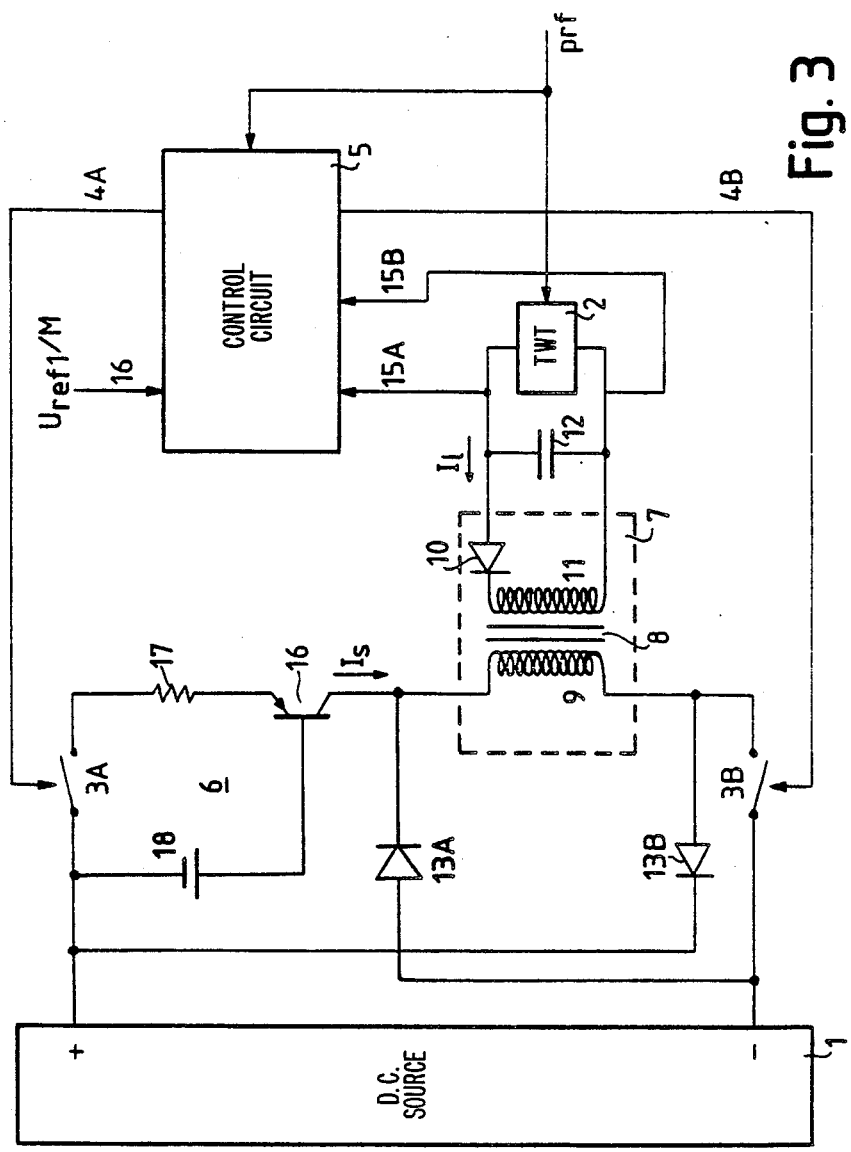
FIG. 3 is a first special embodiment of the power supply according to the invention.

FIG. 3 shows an embodiment of the power supply in which the current source is provided with a PNP transistor 16, a resistor 17 and a reference voltage source 18 for generating a reference voltage $V_{ref3}$. By means of reference voltage $V_{ref3}$ current $I_s$ can be adjusted.

The efficiency of this circuit can be determined as follows: For the amount of energy supplied to buffer 12 applies:

$$W_0 = V_p \cdot I_s \cdot (t_2 - t_1),$$

where $V_p$ is the input voltage across current converter 7. For the amount of energy supplied by the dc power supply applies:

$$W_{in} = V_g \cdot I_s \cdot (t_2 - t_1),$$

where $V_g$ is the voltage of dc power supply 1.

With $V_p = 1.75^{-1} V_g$ as a practical value, the efficiency $\eta$ is:

$$\eta = W_0/W_{in} \cdot 100\% = 1/1.75 \cdot 100\% = 57\%.$$

Figure 4:
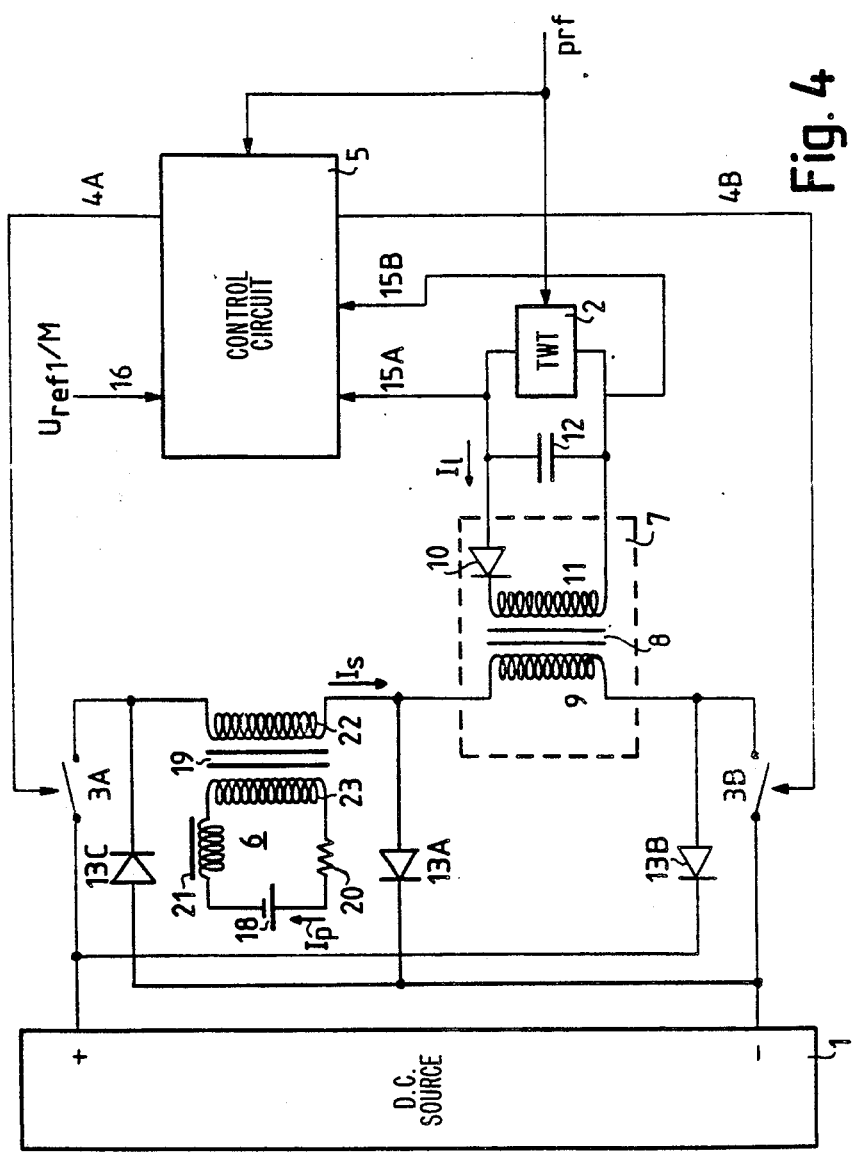
FIG. 4 is a second special embodiment of the power supply according to the invention.

A special embodiment of the power supply with a particularly high efficiency is shown in FIG. 4. Current source 6 consists of a current transducer 19, a resistor 20, a voltage source 18 and selfinduction 21. Because the current transducer secondary (winding 23) is fed with a dc current $I_p = V18/R20$, the said secondary is in a saturated condition. When switches 3A and 3B are closed, a voltage occurs across primary winding 23. For the resulting current applies:

$$I_s = N_s/N_p \cdot I_p,$$

where $N_s/N_p$ is the winding ratio of current transducer 19. As long as switches 3A and 3B are closed, this current will keep going until the current transducer on the other side of the B-H curve of the core material is saturated. However, switches 3A and 3B cannot be closed for that amount of time. This is prevented by the limited time during which switches 3A and 3B are closed.

A certain amount of energy $W_1 = (V_g - V_p) \cdot I_s (t_2 - t_1)$ is stored in selfinduction 21 during the period $t_1$ to $t_2$. As from $t = t_2$, an amount of energy $W_2 = V_g \cdot I_s \cdot t_r$ is returned to dc power supply 1 during a period of $t_r$ seconds, with the result that, using condition $W_1 = W_2$, applies:

$$t_r = (V_g - V_p)/V_g \cdot (t_2 - t_1).$$

The energy losses now consist in the losses $W_{13}$ in diodes 13A and 13C, $W_{22}$ in windings 22, $W_{20}$ in resistor 20 and the losses $W_3$ in switches 3A en 3B. For the above applies:

$$W_{13} = 2V_{13} \cdot I_s \cdot t_r$$

$$W_{22} = I_s^2 \cdot R_{22}(t_r + (t_2 - t_1))$$

$$W_{20} = (N_s/N_p \cdot I_s)^2 \cdot R_{20}$$

$$W_3 = 2I_s \cdot V_3 \cdot (t_2 - t_1),$$

where $V_{13}$ is the threshold voltage of a diode 13A or 13C and $V_3$ is the voltage across a switch 3A or 3B. Using practical values for the variates of the above formulas, a 93% efficiency can be realised. This especially high efficiency is achieved mainly as a result of the low output inpedance of current source 6.

Figure 5:
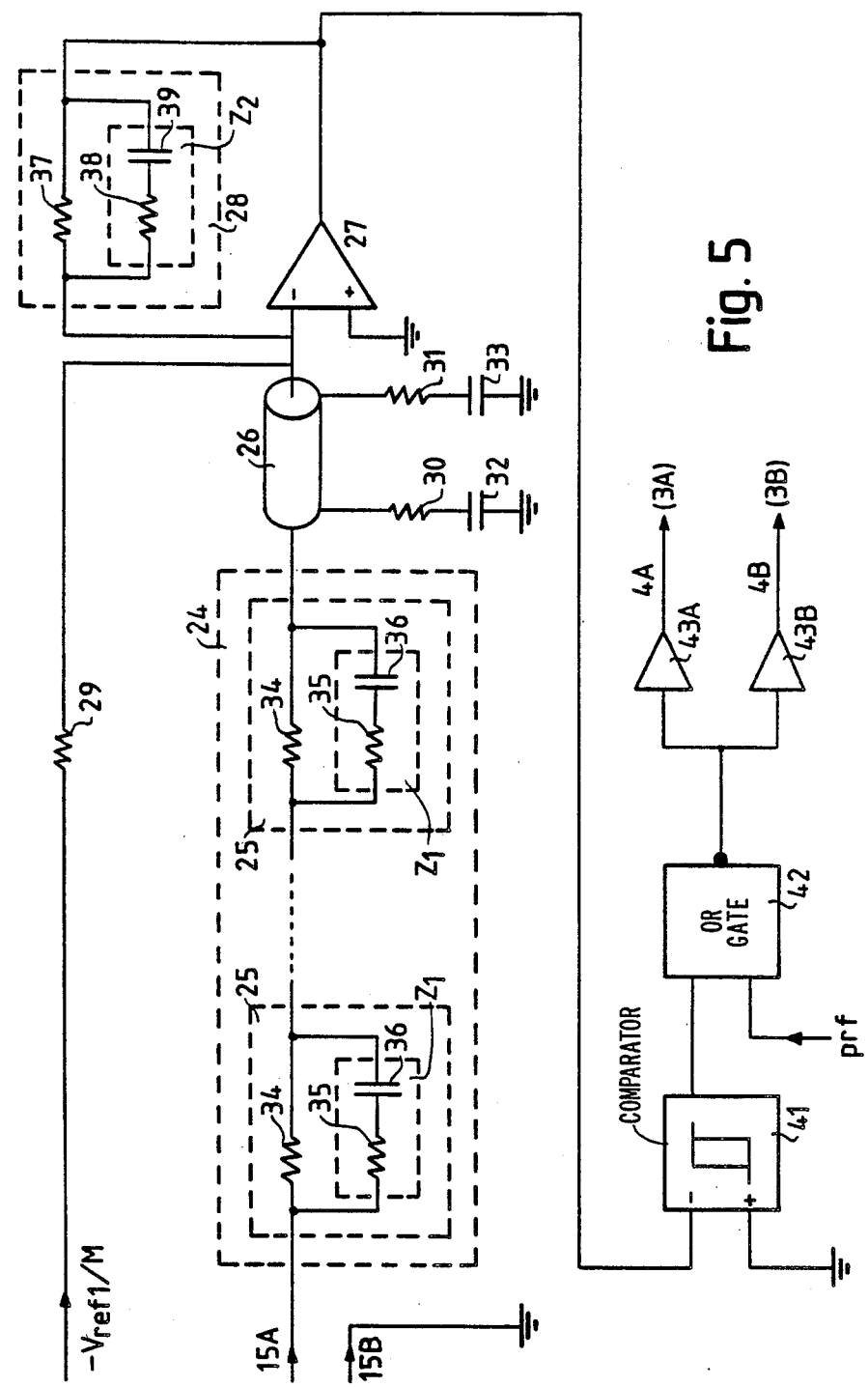
FIG. 5 is an embodiment of the control circuit of the power supply.

FIG. 5 shows a possible embodiment of control circuit 5. Because voltage $V_b$ is in the region of 30–50 kV for a helix, an accurate attentuation of the voltage will be required before the voltage is suitable for further processing. For this purpose, control circuit 5 is arranged in such a way that not $-V_{ref1}$ is used as a reference voltage but $-V_{ref1}/M$. A low reference voltage $-V_{ref1}/M$, where $M \gg 1$, is clearly much simpler to generate than $V_{ref1}$. For this purpose, line 15B is connected to earth, while line 15A is connected to an end of a circuit 24, which consists of N identical impedances 25 connected in series. The other end of circuit 24 is connected via a coaxial cable 26 with the inverting input of a operational amplifier 27. The operational amplifier has a negative feedback with an impedance 28. The non-inverting input of the operational amplifier is connected to earth. A reference voltage $-V_{ref1}/M$ is applied via resistor 29 to the inverting input of amplifier 27. The sheath of coaxial cable 26 is also connected to earth, while the core of coaxial cable 26 is connected to earth on both sides via resistors 30 and 31 respectively and capacitors 32 and 33 respectively. An impedance 25 consists of a parallel circuit of a resistor 34 and an impedance $Z_1$, where $Z_1$ represents a resistor 35 and capacitor 36 connected in series. Impedance 28 consists of a parallel circuit of a resistor 37 and an impedance $Z_2$, where $Z_2$ represents a resistor 38 and capacitor 39 connected in series. The circuit is dimensioned in such a way that, if $V_b > V_{ref1}$, the output voltage of the operational amplifier $V_0 > 0$, while, if $V_b < V_{ref1}$, voltage $V_0 < 0$.

Let us assume that every resistor 34 has a resistance value of $A\Omega$, and resistor 29 has a resistance value of $N \cdot M \Omega$, while resistor 37 has a resistance value of $A/B \Omega$. Application of the second law of Kirchoff to the junction of the inverting input of operational amplifier 27, together with the knowledge that the input current of an operational amplifier is practically zero, leads to:

$$V_0 = (V_b - V_{ref1}) \cdot (A/B/NA) = (V_b - V_{ref1})(NB)^{-1}$$

where $V_0$ is the output voltage of operational amplifier 27. If $NB > 1$, this formula represents the properties of a voltage divider. The ac amplification factor $\Delta V_b/\Delta V_0$ for the signals via line 15A is $Z_{28}/Z_{25}$, where $Z_{28}$ and $Z_{25}$ respectively represent impedances 28 and 25. To achieve resonance-free transmission, resistors 35, 38 and capacitors 36, 39 are attuned to each other in a commonly known way to obtain:

$$R_{35}/R_{38} = Z_1/Z_2.$$

This had the advantage that to obtain tuning in accordance with this formula, in principal no adjustment is required with respect to the stray capacitance of coaxial cable 26.

The resistance values of resistors 30 and 31 are selected the same as the characteristic resistor of coaxial cable 26 to obtain reflection-free termination. Capacitors 32 and 33 are included to ensure that the dc transmission is not affected by the last-mentioned resistors.

The circuit shown in FIG. 5 is especially in susceptible to interference because of the low impedance of points A-B and C-D. The noise and interference level will be low because reference voltage $V_{ref1}/M$ is directly connectable, with no need for extra attenuations and, after connection, amplifications.

Subsequently, output voltage $V_0$ is supplied via line 40 to the inverting input of a comparator 41, which is provided with a hysteresis $\Delta V$. For the hysteresis applies:

$$\Delta V = V_{ref1} - V_{ref2}/M$$

The non-inverting input of comparator 41 is connected to earth. The hysteresis is applied to ensure that control circuit 5 closes switches 3A and 3B when $V_b < V_{ref2}$, as indicated in FIG. 3. The logical output signal of comparator 41 is supplied to a first input of an inverting OR gate. The second input of OR gate 42 is controlled by the control signal (Prf) which triggers TWT 2. This ensures that switches 3A and 3B are closed when $V_b < V_{ref2}$ or when TWT 2 starts generating an output pulse. It is also possible that the control circuit is not supplied with the signal triggering TWT 2 because voltage $V_b$ sinks to a value below $V_{ref2}$ some time after TWT 2 starts transmitting a pulse. However, OR gate 42 is used to ensure that buffer 12 is charged at an early stage, so that it is prepared in time for the generation of a new transmission pulse by means of TWT 2.

Finally, the output signal of OR gate 42 is supplied to two identical amplifiers 43A and 43B, which control switches 3A and 3B via lines 4A and 4B respectively.

I claim:

1. A switching power supply including a dc voltage source for generating a dc voltage for a pulsating load comprising:
   buffer means for powering said load;
   converter means having a primary and a secondary, said secondary connected to the buffer means;
   a constant current source connected to the dc voltage source;
   switch means connected to said constant current source and the primary of said converter means; and
   load responsive control means connected to the switch means for selectively connecting said constant current source to the primary of the converter means in response to said pulsating load.

2. A switching power supply as claimed in claim 1, wherein the constant current source comprises a current transducer having a first winding and a second winding, the first winding being connected in series with the dc voltage source; and control-current-generating means connected to the second winding for the determination of the current through the first winding.

3. A switching power supply as claimed in claim 2, comprising diode means connecting the converter means and the first winding of the current transducer to the dc voltage supply, for ensuring that when the said switch means is open, the energy stored in the converter and current transducer can flow back to the dc voltage source.

4. A switching power supply as claimed in claim 1, wherein the constant current source comprises a transistor having a base supplied with a reference voltage for providing a current which is a function of the reference voltage.

5. A switching power supply as claimed in claim 2 comprising diode means connected to the converter means and to the terminals of the dc voltage source in such a way that, when the said switch means is open, the energy stored in the converter means flows back to the dc voltage source.

6. A switching power supply as claimed in any of claims 2-5 and 1, in which the control means closes the switch means as soon as the pulsating load starts drawing energy from the buffer, and when the buffer voltage sinks below a first reference value and wherein the control means opens the switch means when the voltage across the buffer rises above a second reference value.

7. A switching power supply as claimed in claims 2-5 and 1, in which the converter means comprises rectifiers which are connected to said secondary.

* * * * *